US 6,677,798 B2

(12) United States Patent
Chang et al.

(10) Patent No.: US 6,677,798 B2
(45) Date of Patent: Jan. 13, 2004

(54) HIGH SPEED VOLTAGE LEVEL SHIFTER

(75) Inventors: Hung-Yi Chang, Hsinchu (TW); Yi-Hwa Chang, Hsinchu Hsien (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/067,200

(22) Filed: Feb. 7, 2002

(65) Prior Publication Data

US 2003/0146781 A1 Aug. 7, 2003

(51) Int. Cl.[7] .................................................. H03L 5/00
(52) U.S. Cl. ............................ 327/333; 326/68; 326/81; 327/536
(58) Field of Search ................................ 327/333, 536, 327/589; 326/68, 63, 80, 81

(56) References Cited

U.S. PATENT DOCUMENTS 5,894,230 A * 4/1999 Voldman ..................... 326/86
5,994,944 A * 11/1999 Manyoki ..................... 327/333
6,255,888 B1 * 7/2001 Satomi ........................ 327/333
6,404,237 B1 * 6/2002 Mathew et al. .............. 326/113

* cited by examiner

Primary Examiner—Terry D. Cunningham
Assistant Examiner—Quan Tra
(74) Attorney, Agent, or Firm—Birch, Stewart, Kolasch & Birch, LLP

(57) ABSTRACT

A high speed voltage level shifter for use in circuitry having core circuits operating at a very low supply voltage includes a boost circuit for producing a boosted signal in accordance with a non-inverted input signal, and a voltage shifting stage for producing an output signal in response to an inverted input signal and the boosted signal. The boost circuit translates the boosted signal into a middle voltage level when the non-inverted input signal is at logic '0'. When the inverted input signal and the boosted signal are both at the logic '0', the voltage shifting stage provides the output signal with a high voltage level. Otherwise, the voltage shifting stage pulls down the output signal to ground when the boosted signal is at the middle voltage level and the inverted input signal is at a low voltage level equal to the very low supply voltage level.

20 Claims, 4 Drawing Sheets

HIGH SPEED VOLTAGE LEVEL SHIFTER

FIELD OF THE INVENTION

The present invention relates generally to integrated circuits and, in particular, to a high speed voltage level shifter.

BACKGROUND OF THE INVENTION

With the introduction of integrated circuits with geometry below 0.13 μm, lower power supply voltages have become necessary to maintain device reliability. Consequently, supply voltage has decreased from 3.3 volts to 1.2 volts or less. However, many interface signals still use the logic level from 0 to 3.3 or 5 volts. The circuitry therefore can be divided into "core" circuits and I/O circuits, where the core logic operates at the lower 1.2 volts, and the I/O circuits operate at 3.3 volts. To interface between circuits requiring different voltage levels, a voltage level shifter is employed to switch between the voltage levels of the respective circuits.

FIG. 1 shows a well-known circuit implementation of a voltage level shifter 100. A NMOS transistor MN1 has its gate connected to a core circuit supply voltage ($V_{CCL}$). Both PMOS transistors MP1, MP2 have their sources connected to an I/O voltage source $V_{CCH}$, which has a higher voltage potential than $V_{CCL}$. The level shifter 100 translates a low voltage input signal at an input terminal 110 to a high voltage output signal at an output terminal 130. For such a voltage level shifter to operate properly, the PMOS transistor MP1 is "weak" compared to the transistors MN1, MN2 and MP2.

With continued reference to FIG. 1, when the input signal is logic low, the NMOS transistor MN2 is "on" via an inverter 120. As a result, the NMOS transistor MN2 electrically drives the output terminal 130 to ground. Further, the logic low output signal turns "on" the PMOS transistor MP1 which provides the supply voltage $V_{CCH}$ to a gate of the PMOS transistor MP2, thereby the PMOS transistor MP2 is held "off".

When the input signal goes high, the NMOS transistor MN2 is turned "off". The NMOS transistor MN1 electrically connects the gate of the PMOS transistor MP2 to an inverted input signal at logic low (i.e., ground). Hence, the PMOS transistor MP2 is turned "on" and provides the supply voltage $V_{CCH}$ to the output terminal 130.

The voltage level shifter 100 is suitable for ordinary applications. However, when the supply voltage $V_{CCL}$ approaches 1.2 volts or less, the NMOS transistors in the level shifter 100 cannot be conducted sufficiently due to a typical threshold voltage of 0.8 volts. The gate voltage that brings about conduction in a transistor is called the threshold voltage. In the case of an input signal having a voltage swing between 0 and 1.2 volts, an output signal at the output terminal 130 should be logic low when the gate of the NMOS transistor MN2 is at 1.2 volts, e.g. logic high. Nevertheless, the NMOS transistor MN2 cannot be turned "on" sufficiently since the voltage drop across the gate and source of the NMOS transistor MN2 is no more than 0.4 volts, which barely allows it to overcome the pull-up capability of the PMOS transistor MP2. As a result, the output signal is weakly pulled to ground by NMOS transistor MN2. Referring to FIG. 2, the input signal IN shown is a substantially square wave having a low voltage level of 0 and a high voltage level of 1.2 volts. The output signal OUT has a voltage swing between 0 and 3.3 volts. It can be seen that the output signal OUT is poor and suffers from relatively slow falling time. Such a defect is further exacerbated when the supply voltage $V_{CCL}$ for "core" circuits is even lower. Hence, owing to its relative slowness the prior art level shifter 100 cannot be applied to high speed circuitry with "core" circuits having a very low supply voltage.

Accordingly, what is needed is a high speed voltage level shifter that overcomes the disadvantages associated with the prior art.

SUMMARY OF THE INVENTION

It is an object of the present invention to provide a high speed voltage level shifter for use in circuitry having "core" circuits which operate at a very low supply voltage.

The present invention is directed to a voltage level shifter including a boost circuit and a voltage shifting stage. The voltage level shifter also has an input terminal and an output terminal. The input terminal is used to receive a non-inverted input signal having a first voltage level and a second voltage level, in which the first voltage level is a reference voltage level and the second voltage level is higher than the first voltage level. The boost circuit receives the non-inverted input signal. According to the non-inverted input signal, the boosted circuit produces a boosted signal, where the boosted signal is at a third voltage level when the non-inverted input signal is at the first voltage level, and at the first voltage level when the non-inverted input signal is at the second voltage level. In particular, the third voltage level is higher than the second voltage level. The voltage shifting stage is coupled to the boost circuit. In response to an inverted input signal and the boosted signal, the voltage shifting stage produces an output signal at a fourth voltage level when the inverted input signal and the boosted signal are both at the first voltage level, and at the first voltage level when the inverted input signal is at the second voltage level and the boosted signal is at the third voltage level. Therefore, the output terminal is used to provide the output signal having an output voltage swing between the first voltage level and the fourth voltage level.

In a preferred embodiment, the boost circuit includes a capacitor for producing an intermediate signal at the third voltage level when the inverted input signal is at the second voltage level. The boost circuit also has a first P-type transistor, a second P-type transistor, and a first N-type transistor. In response to the inverted input signal, the first P-type transistor charges the capacitor when the inverted input signal is at the first voltage level. When the non-inverted input signal is at the second voltage level, the first N-type transistor pulls down the boosted signal to the first voltage level. The second P-type transistor passes the intermediate signal to the boosted signal when the non-inverted input signal is at the first voltage level. Further, the capacitor is charged, by way of the first P-type transistor, from a first power source having the second voltage level, such that the intermediate signal substantially remains at the second voltage level when the inverted input signal is at the first voltage level.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE PREFERRED EMBODIMENT

Figure 1:
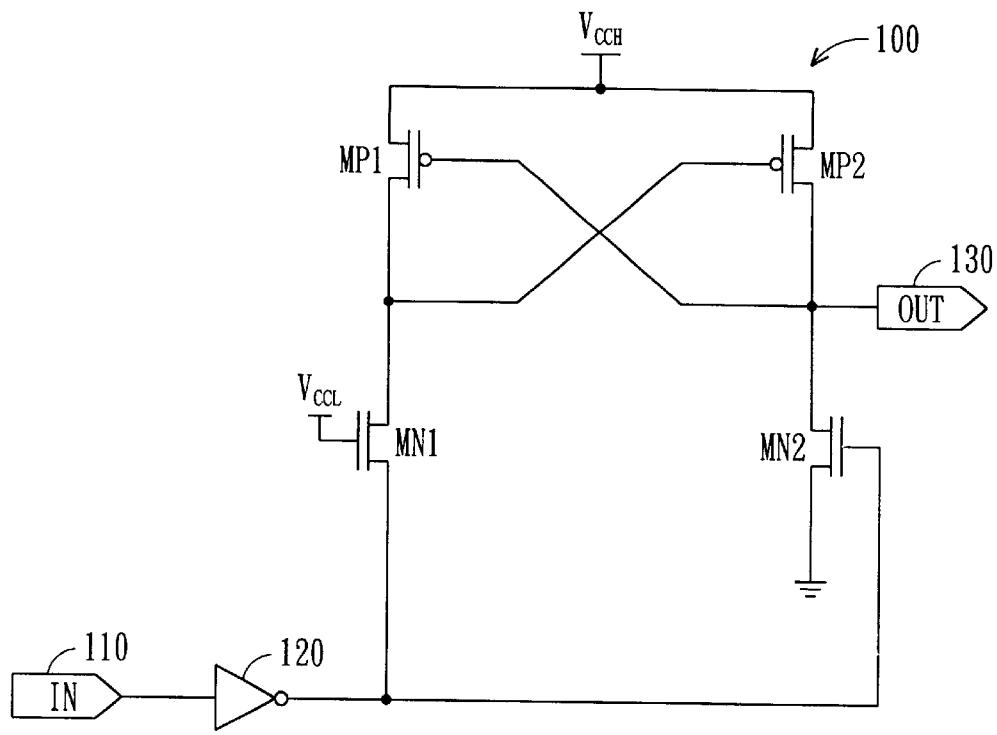
FIG. 1 is a schematic diagram of a prior art voltage level shifter.
Figure 2:
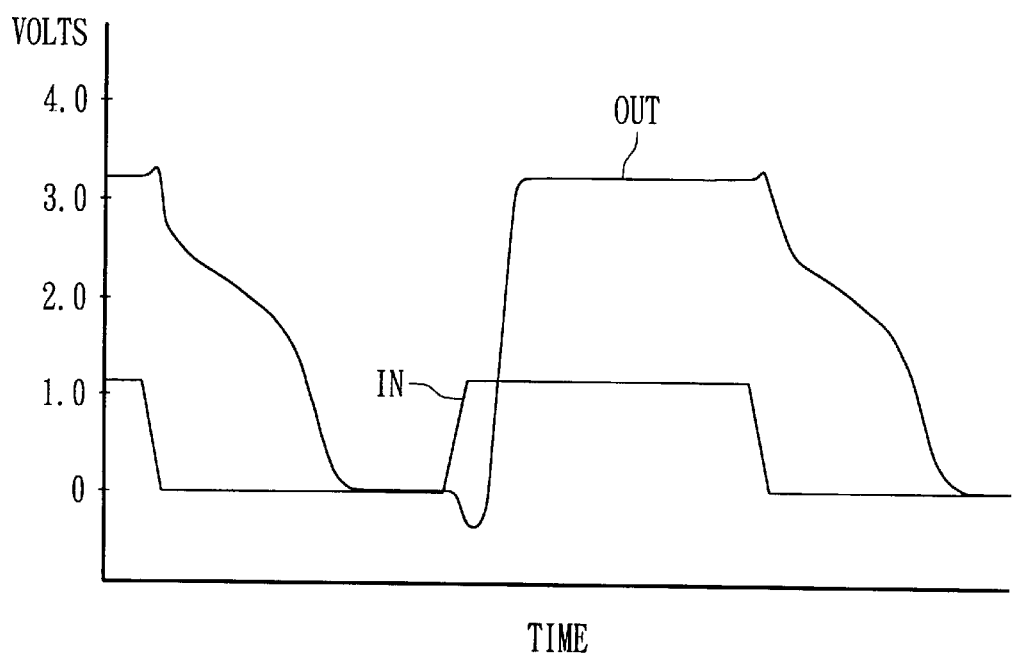
FIG. 2 is a graph showing the input and output signals of the voltage level shifter of FIG. 1.
Figure 3A:
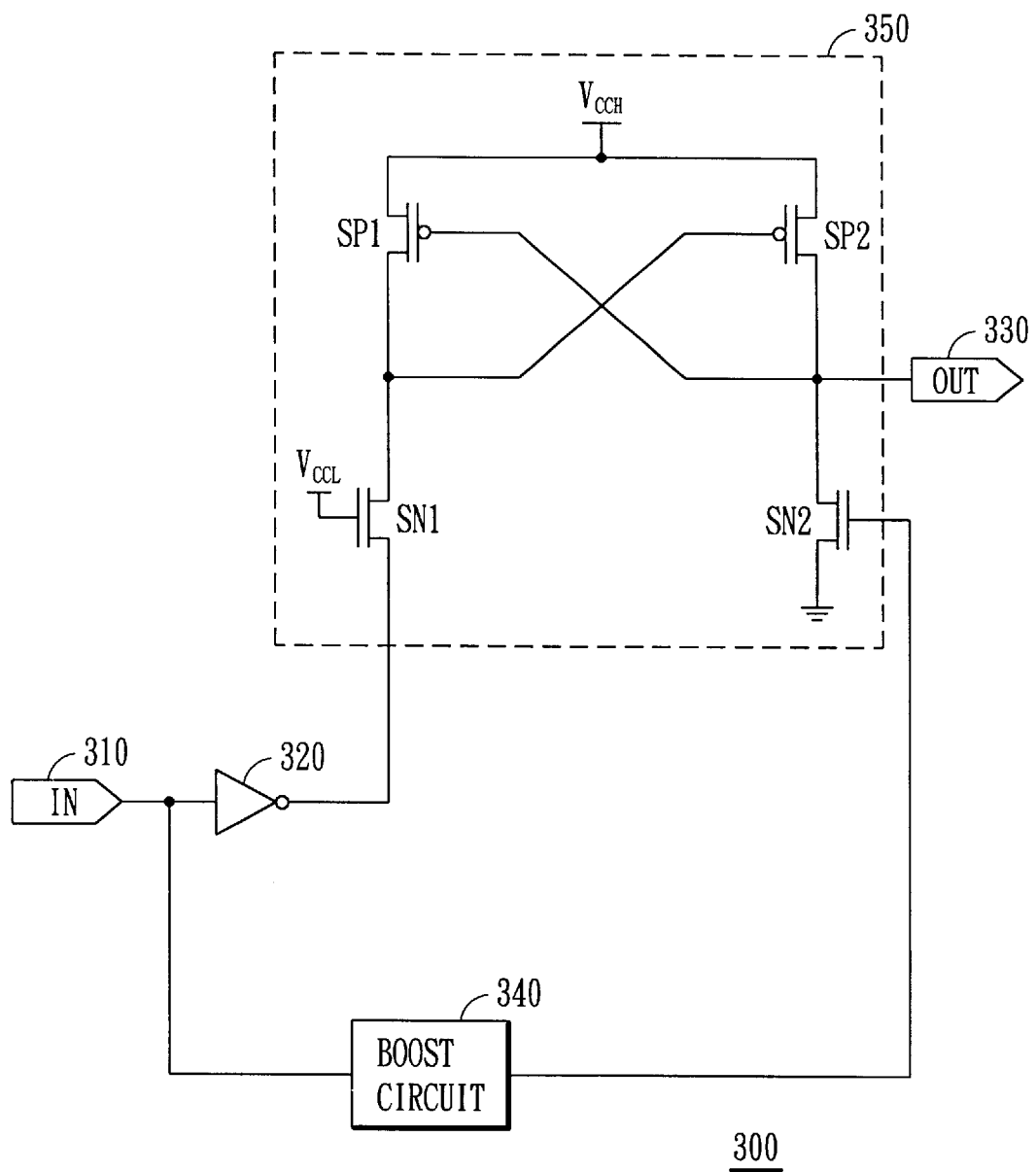
FIG. 3A illustrates a block diagram of the invention.

As illustrated in FIG. 3A, a high speed voltage level shifter 300 of the invention includes a boost circuit 340 and a voltage shifting stage 350. The voltage level shifter 300 also has an input terminal 310 and an output terminal 330. The input terminal 310 is used to receive a non-inverted input signal having a first voltage level and a second voltage level, in which the first voltage level is a reference voltage level and the second voltage level is higher than the first voltage level. An inverter 320 receives the non-inverted input signal from the input terminal 310 and produces an inverted input signal.

The boost circuit 340 receives the non-inverted input signal. According to the non-inverted input signal, the boosted circuit 340 produces a boosted signal varying within a range between the second voltage level and a third voltage level. When the non-inverted input signal is at the first voltage level, the boosted signal is at a third voltage level. When the non-inverted input signal is at the second voltage level, the boosted signal is at the first voltage level. It is noted that the third voltage level is higher than the second voltage level.

The voltage shifting stage 350 is coupled to the boost circuit 340. In response to the inverted input signal and the boosted signal, the voltage shifting stage 350 produces an output signal at the output terminal 330. When the inverted input signal and the boosted signal are both at the first voltage level, the voltage shifting stage 350 provides the output signal at a fourth voltage level. In addition, when the inverted input signal is at the second voltage level and the boosted signal is at the third voltage level, the voltage shifting stage 350 provides the output signal at the first voltage level. The output terminal 350 is used to provide the output signal having an output voltage swing between the first voltage level and the fourth voltage level.

The second and the fourth voltage levels herein are two different supply voltage levels used in the voltage level shifter 300. For an integrated circuit fabricated with 0.13 $\mu$m process, the typical supply voltage level for "core" circuits (the second voltage level) is 1.2 volts and the supply voltage level for interface signals (the fourth voltage level) may be 3.3 volts. It should be understood that other voltage levels are contemplated without limiting the scope of the invention. Furthermore, the first voltage level is ground potential (e.g. 0 volts).

Figure 3B:
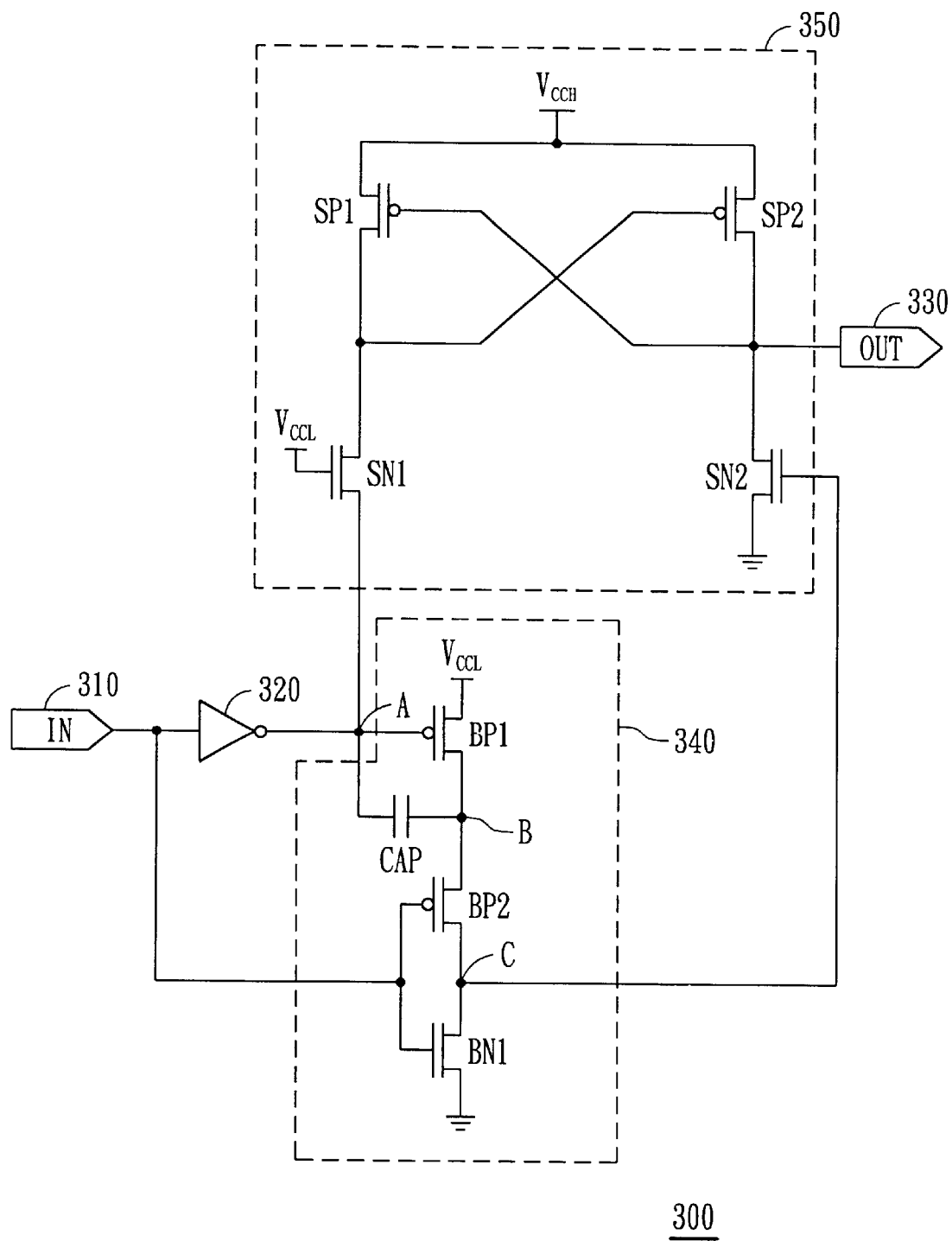
FIG. 3B is a schematic diagram of a preferred embodiment according to the invention.

FIG. 3B illustrates a preferred embodiment of the invention. Each transistor described herein is either a P-type or N-type MOS transistor having a gate, a drain and a source. Since a MOS transistor is typically a symmetrical device, the true designation of "source" and "drain" is only possible once a voltage is impressed on the terminals. The designations of source and drain herein should be interpreted, therefore, in the broadest sense. In the preferred embodiment, the boost circuit 340 includes a capacitor CAP for producing an intermediate signal which substantially incorporates a voltage swing between the second voltage level and the third voltage level. The boost circuit 340 also has a first P-type transistor BP1, a second P-type transistor BP2, and a first N-type transistor BN1. The P-type transistor BP1 has its source coupled to a first power source (i.e. "core" voltage source, $V_{CCL}$), and its gate connected to a first node (node A) to receive the inverted input signal. The capacitor CAP is connected between the gate and drain of the P-type transistor BP1, in which an intermediate signal is provided at the drain of the P-type transistor BP1 (node B). The P-type transistor BP2 has its source connected to the drain of the P-type transistor BP1, its gate connected to the input terminal 310 to receive the non-inverted input signal, and its drain connected to a second node (node C) providing the boosted signal. The N-type transistor BN1 has its drain connected to the drain of P-type transistor BP2 (node C), its gate also connected to the input terminal 310, and its source coupled to ground (the first voltage level).

As depicted, the voltage shifting stage 350 is comprised of a second N-type transistor SN1, a third N-type transistor SN2, a third P-type transistor SP1, and a fourth P-type transistor SP2. It is noted that the P-type transistor SP1 is "weak" compared to the N-type transistor SN1. The N-type transistor SN1 has its gate coupled to the first power source $V_{CCL}$, and its source connected to the node A to receive the inverted input signal. The N-type transistor SN2 has its source coupled to ground, its gate connected to the node C to receive the boosted signal, and its drain connected to the output terminal 330 to provide the output signal. Both P-type transistors SP1 and SP2 have their sources coupled to a second power source $V_{CCH}$ having the fourth voltage level in which the second power source $V_{CCH}$ is the I/O voltage source. The P-type transistor SP1 has its drain connected to the drain of the N-type transistor SN1 and its gate connected to the drain of the N-type transistor SN2. The P-type transistor SP2 has its drain connected to the drain of the N-type transistor SN2, while the gate is connected to the drain of the N-type transistor SN1.

Figure 4:
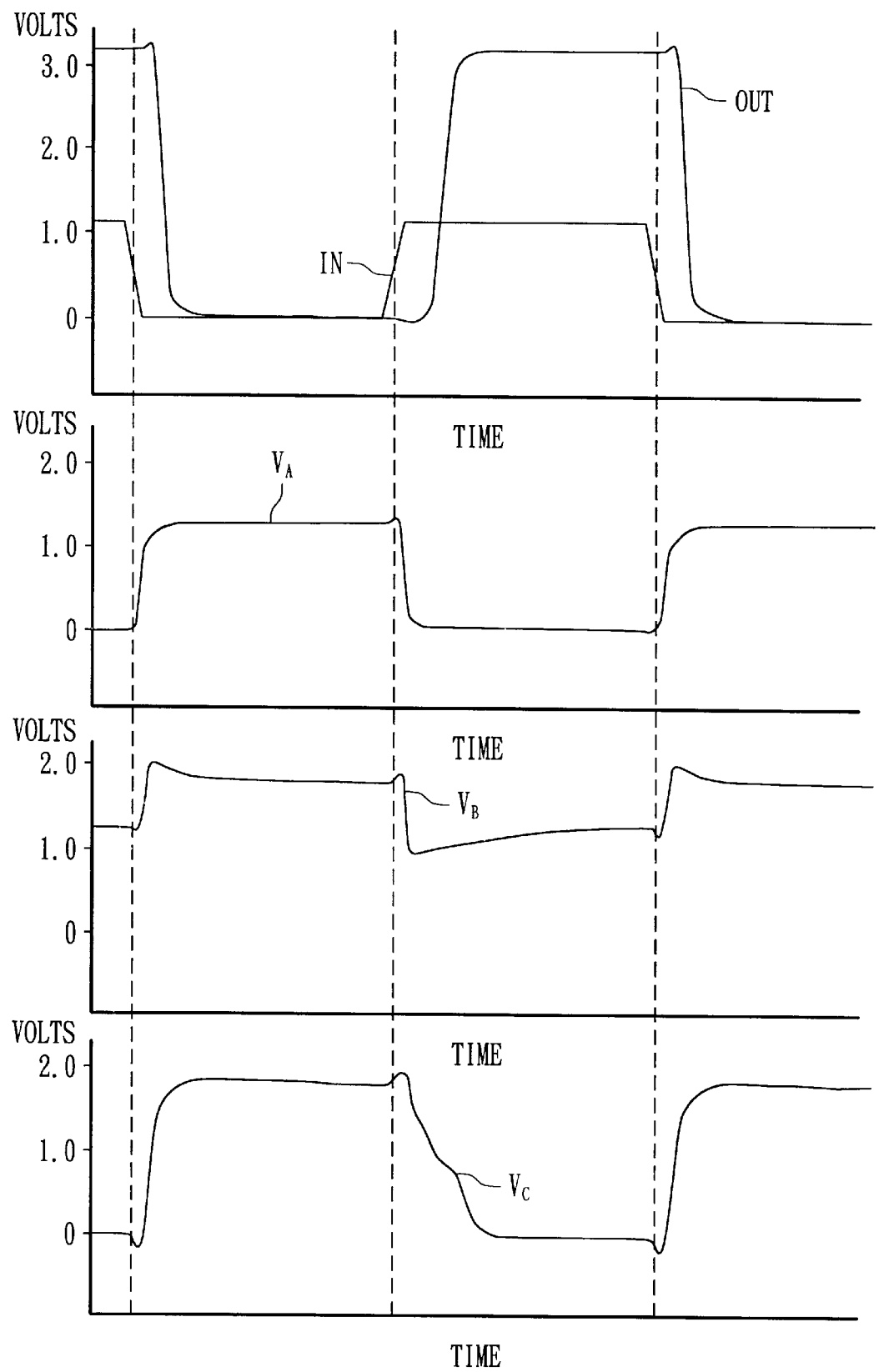
FIG. 4 illustrates a graph useful in understanding the operation of a voltage level shifter of the invention.

With reference to FIG. 3B and FIG. 4, the operation of the voltage level shifter 300 of the invention will be described. If the non-inverted input signal IN is logic high (the second voltage level), the inverted input signal ($V_A$), through the inverter 320, at the node A is logic low (the first voltage level). This state turns "on" the P-type transistor BP1 but turns "off" the P-type transistor BP2, so the capacitor is charged through the P-type transistor BP1 to remain at the second voltage level ($V_{CCL}$). In the preferred embodiment, the intermediate signal at the node B ($V_B$) is substantially equal to the second voltage level when the node A is at the first voltage level. The boosted signal at the node C ($V_C$) is pulled to ground through the N-type transistor BN1 when the non-inverted input signal is at logic high, which allows the N-type transistor SN2 to be turned "off". As the node A transits to logic low, the N-type transistor SN1 is turned "on" and pulls the gate of the P-type transistor SP2 to the first voltage level (i.e., ground). The P-type transistor SP2 is turned "on" and provides the supply voltage $V_{CCH}$ to the output terminal 330. Thus, the output signal OUT is at the fourth voltage level, and the P-type transistor SP1 is turned "off".

The output signal OUT remains at $V_{CCH}$ until the non-inverted input signal at the input terminal 310 changes state. When the state of the non-inverted input signal goes from a high to a low state, the output of the inverter 320, or the node A ($V_A$), goes high (the second voltage level). The P-type transistor BP2 is turned "on" but the P-type transistor BP1 and the N-type transistor BN1 are turned "off". The N-type transistor SN1 is also turned "off" via the inverted signal at the node A. As the P-type transistor BP1 is "off", the intermediate signal at the node B ($V_B$) increases to the third voltage level due to the electrical charges stored in the capacitor CAP. In other words, since the voltage drop across a capacitor may not change abruptly, the capacitor CAP boosts the intermediate signal to the third voltage level when the inverted input signal is at the second voltage level. The P-type transistor BP2 passes the intermediate signal to the boosted signal at the node C ($V_C$) as shown in FIG. 4, when the non-inverted input signal is at the first voltage level. According to the invention, the N-type transistor SN2 is turned "on" and is conducted sufficiently by increasing the node C to a voltage of approximately 1.7~2.0 volts, i.e., the third voltage level. The use of the boost circuit 340 ensures that the applied gate voltage of the N-type transistor SN2 is high enough to bring about strong conduction. As such, the N-type transistor SN2 electrically connects the output terminal 330 to ground which strongly pulls down the output signal OUT to the first voltage level. Further, the output signal OUT turns "on" the P-type transistor SP1 which provides the supply voltage $V_{CCH}$ to the gate of the P-type transistor SP2, thereby the P-type transistor SP2 is held "off".

The output signal OUT, as depicted in FIG. 4, is substantially improved as compared to the prior art. Accordingly, the boosted circuit 340 enhances the response time of the voltage level shifter 300 such that the falling time of the output signal is substantially improved over the prior art. In addition, the improved falling time of the voltage level shifter 300 produces a substantially improved switching speed.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A voltage level shifter comprising:
    an input terminal, for receiving a non-inverted input signal having a first voltage level and a second voltage level, wherein the first voltage level is a reference voltage level and the second voltage level is higher than the first voltage level;
    a boost circuit receiving the non-inverted input signal, for producing a boosted signal in accordance with the non-inverted input signal, the boosted signal at a third voltage level when the non-inverted input signal is at the first voltage level, and at the first voltage level when the non-inverted input signal is at the second voltage level, wherein the third voltage level is higher than the second voltage level;
    a voltage shifting stage coupled to the boost circuit, for producing an output signal in response to an inverted input signal and the boosted signal, the output signal at a fourth voltage level when the inverted input signal and the boosted signal are both at the first voltage level, and at the first voltage level when the inverted input signal is at the second voltage level and the boosted signal is at the third voltage level, the voltage shifting stage comprising:
        a first N-type transistor having a gate, a source and a drain, where the source of the first N-type transistor is connected to a first node to receive the inverted input signal, the gate of the first N-type transistor is coupled to a first power source having the second voltage level;
        a second N-type transistor having a gate, a source and a drain, where the source of the second N-type transistor is coupled to the first voltage level, the gate of the second N-type transistor is disconnected from the drain of the first N-type transistor and connected to the boost circuit to receive the boosted signal;
        a first P-type transistor having a gate, a source and a drain, where the source of the first P-type transistor is coupled to a second power source having the fourth voltage level, the drain of the first P-type transistor is connected to the drain of the first N-type transistor, and the gate of the first P-type transistor is connected to the drain of the second N-type transistor; and
        a second P-type transistor having a gate, a source and a drain, where the source of the second P-type transistor is coupled to the second power source, the drain of the second P-type transistor is connected to the drain of the second N-type transistor, and the gate of the second P-type transistor is connected to the drain of the first N-type transistor; and
        an output terminal coupled to the drain of the second N-type transistor and the drain of the second P-type transistor, for providing the output signal which has an output voltage swing between the first voltage level and the fourth voltage level.

2. The voltage level shifter of claim 1 wherein the boost circuit comprises:
    a capacitor, for producing an intermediate signal at the third voltage level when the inverted input signal is at the second voltage level;
    a third P-type transistor, responsive to the inverted input signal, for charging the capacitor when the inverted input signal is at the first voltage;
    a third N-type transistor, responsive to the non-inverted input signal, for pulling down the boosted signal to the first voltage level when the non-inverted input signal is at the second voltage level; and
    a fourth P-type transistor, for passing the intermediate signal to the boosted signal when the non-inverted input signal is at the first voltage level;
    wherein the capacitor is charged, by way of the third P-type transistor, from the first power source having the second voltage level, such that the intermediate signal substantially remains at the second voltage level when the inverted input signal is at the first voltage level.

3. The voltage level shifter of claim 2 wherein the third P-type transistor has a gate, a source and a drain, where the source of the third P-type transistor is coupled to the first power source, the gate of the third P-type transistor is connected to the first node to receive the inverted input signal, and the drain of the third P-type transistor is connected to the fourth P-type transistor.

4. The voltage level shifter of claim 3 wherein the capacitor is connected between the gate and the drain of the third P-type transistor, and wherein the intermediate signal is provided at the drain of the third P-type transistor.

5. The voltage level shifter of claim 4 wherein the fourth P-type transistor has a gate, a source and a drain, where the source of the fourth P-type transistor is connected to the drain of the third P-type transistor, the gate of the fourth P-type transistor is connected to the input terminal to receive the non-inverted input signal, and the drain of the fourth P-type transistor is connected to a second node providing the boosted signal.

6. The voltage level shifter of claim 5 wherein the third N-type transistor has a gate, a source and a drain, where the drain of the third N-type transistor is connected to the second node, the gate of the third N-type transistor is connected to the input terminal to receive the non-inverted input signal, and the source of the third N-type transistor is coupled to the first voltage level.

7. The voltage level shifter of claim 1 further comprising an inverter connected between the input terminal and the first node, for receiving the non-inverted input signal to produce the inverted input signal.

8. The voltage level shifter of claim 1 wherein the fourth voltage level is higher than the third voltage level.

9. A voltage level shifter, comprising:
an input terminal, for receiving a non-inverted input signal having a first voltage level and a second voltage level, wherein the first voltage level is a reference voltage level and the second voltage level is higher than the first voltage level;
a boost circuit, for producing a boosted signal, which includes:
a capacitor, for producing an intermediate signal at a third voltage level when an inverted input signal is at the second voltage level, wherein the third voltage level is higher than the second voltage level;
a first P-type transistor, responsive to the inverted input signal, for charging the capacitor when the inverted input signal is at the first voltage;
a first N-type transistor, responsive to the non-inverted input signal, for pulling down the boosted signal to the first voltage level when the non-inverted input signal is at the second voltage level; and
a second P-type transistor, for passing the intermediate signal to the boosted signal when the non-inverted input signal is at the first voltage level;
wherein the capacitor is charged, by way of the first P-type transistor, from a first power source having the second voltage level, such that the intermediate signal substantially remains at the second voltage level when the inverted input signal is at the first voltage level;
a voltage shifting stage coupled to the boost circuit, for producing an output signal in response to the inverted input signal and the boosted signal, the output signal at a fourth voltage level when the inverted input signal and the boosted signal are both at the first voltage level, and at the first voltage level when the inverted input signal is at the second voltage level and the boosted signal is at the third voltage level, the voltage shifting stage comprising:
a second N-type transistor having a gate, a source and a drain, where the source of the second N-type transistor receives the inverted input signal, the gate of the second N-type transistor is coupled to the first power source;
a third N-type transistor having a gate, a source and a drain, where the gate of the third N-type transistor receives the boosted signal, the source of the third N-type transistor is coupled to the first voltage level;
a third P-type transistor having a gate, a source and a drain, where the source of the third P-type transistor is coupled to a second power source having the fourth voltage level, the drain of the third P-type transistor is connected to the drain of the second N-type transistor, and the gate of the third P-type transistor is connected to the drain of the third N-type transistor; and
a fourth P-type transistor having a gate, a source and a drain, where the source of the fourth P-type transistor is coupled to the second power source, the drain of the fourth P-type transistor is connected to the drain of the third N-type transistor, and the gate of the fourth P-type transistor is connected to the drain of the second N-type transistor; and
an output terminal coupled to the drain of the third N-type transistor and the drain of the fourth P-type transistor, for providing the output signal which has an output voltage swing between the first voltage level and the fourth voltage level.

10. The voltage level shifter of claim 9 wherein the first P-type transistor has a gate, a source and a drain, where the source of the first P-type transistor is coupled to the first power source, the gate of the first P-type transistor is connected to a first node to receive the inverted input signal, and the drain of the first P-type transistor is connected to the second P-type transistor.

11. The voltage level shifter of claim 10 wherein the capacitor is connected between the gate and the drain of the first P-type transistor, and wherein the intermediate signal is provided at the drain of the first P-type transistor.

12. The voltage level shifter of claim 11 wherein the second P-type transistor has a gate, a source and a drain, where the source of the second P-type transistor is connected to the drain of the first P-type transistor, the gate of the second P-type transistor is connected to the input terminal to receive the non-inverted input signal, and the drain of the second P-type transistor is connected to a second node providing the boosted signal.

13. The voltage level shifter of claim 12 wherein the first N-type transistor has a gate, a source and a drain, where the drain of the first N-type transistor is connected to the second node, the gate of the first N-type transistor is connected to the input terminal to receive the non-inverted input signal, and the source of the first N-type transistor is coupled to the first voltage level.

14. The voltage level shifter of claim 13 further comprising an inverter connected between the input terminal and the first node, for receiving the non-inverted input signal to produce the inverted input signal.

15. The voltage level shifter of claim 9 wherein the fourth voltage level is higher than the third voltage level.

16. A voltage level shifter comprising:
an input terminal configured to receive a non-inverted input signal having a first voltage level and a second voltage level, wherein the second voltage level is higher than the first voltage level;
a boost circuit having a first node and a second node, configured to receive the non-inverted input signal and produce a boosted signal at the second node in accordance with the non-inverted input signal, wherein the boosted signal swings between the first voltage level and a third voltage level higher than the second voltage level;
a voltage shifting stage coupled between the first and the second nodes of the boost circuit, configured to produce an output signal in response to an inverted input signal and the boosted signal, comprising:
a first N-type transistor having a gate, a source and a drain, where the source of the first N-type transistor is connected to the first node to receive the inverted input signal, the gate of the first N-type transistor is coupled to a first power source having the second voltage level; and
a second N-type transistor having a gate, a source and a drain, where the source of the second N-type transistor is coupled to the first voltage level, the gate of the second N-type transistor is disconnected from the drain of the first N-type transistor and connected to the second node to receive the boosted signal; and an output terminal coupled to the drain of the second N-type transistor, configured to provide the output signal which has an output voltage swing between the first voltage level and a fourth voltage level higher than the third voltage level.

17. The voltage level shifter of claim 16 wherein the voltage shifting stage further comprises:

a first P-type transistor having a gate, a source and a drain, where the source of the first P-type transistor is coupled to a second power source having the fourth voltage level, the drain of the first P-type transistor is connected to the drain of the first N-type transistor, and the gate of the first P-type transistor is connected to the drain of the second N-type transistor; and a second P-type transistor having a gate, a source and a drain, where the source of the second P-type transistor is coupled to the second power source, the drain of the second P-type transistor is connected to the drain of the second N-type transistor, and the gate of the second P-type transistor is connected to the drain of the first N-type transistor.

18. The voltage level shifter of claim 17 wherein the boost circuit comprises:

a capacitor, for producing an intermediate signal at the third voltage level when the inverted input signal is at the second voltage level;

a third P-type transistor, responsive to the inverted input signal, for charging the capacitor when the inverted input signal is at the first voltage;

a third N-type transistor, responsive to the non-inverted input signal, for pulling down the boosted signal to the first voltage level when the non-inverted input signal is at the second voltage level; and a fourth P-type transistor, for passing the intermediate signal to the boosted signal when the non-inverted input signal is at the first voltage level;

wherein the capacitor is charged, by way of the third P-type transistor, from the first power source having the second voltage level, such that the intermediate signal substantially remains at the second voltage level when the inverted input signal is at the first voltage level.

19. The voltage level shifter of claim 17 wherein the boost circuit comprises:

a third P-type transistor having a gate, a source and a drain, where the source of the third P-type transistor is coupled to the first power source, the gate of the third P-type transistor is connected to the first node to receive the inverted input signal;

a fourth P-type transistor having a gate, a source and a drain, where the source of the fourth P-type transistor is connected to the drain of the third P-type transistor, the gate of the fourth P-type transistor is connected to the input terminal to receive the non-inverted input signal, and the drain of the fourth P-type transistor is connected to the second node;

a third N-type transistor having a gate, a source and a drain, where the drain of the third N-type transistor is connected to the second node to provide the boosted signal, the gate of the third N-type transistor is connected to the input terminal to receive the non-inverted input signal, and the source of the third N-type transistor is coupled to the first voltage level; and a capacitor connected between the gate and the drain of the third P-type transistor.

20. The voltage level shifter of claim 16 further comprising an inverter connected between the input terminal and the first node, for receiving the non-inverted input signal to produce the inverted input signal.

* * * * *